US012588397B2

(12) United States Patent
Tian et al.

(10) Patent No.: US 12,588,397 B2
(45) Date of Patent: Mar. 24, 2026

(54) DISPLAY SUBSTRATE AND MANUFACTURING METHOD THEREOF, DISPLAY DEVICE, WEARABLE DEVICE, AND DISPLAY METHOD

(71) Applicant: BOE Technology Group Co., Ltd., Beijing (CN)

(72) Inventors: Xueyan Tian, Beijing (CN); Chunyang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 115 days.

(21) Appl. No.: 17/764,335

(22) PCT Filed: Mar. 22, 2021

(86) PCT No.: PCT/CN2021/082160
§ 371 (c)(1),
(2) Date: Mar. 28, 2022

(87) PCT Pub. No.: WO2022/198407
PCT Pub. Date: Sep. 29, 2022

(65) Prior Publication Data
US 2024/0049557 A1 Feb. 8, 2024

(51) Int. Cl.
H10K 59/80 (2023.01)
H10K 59/12 (2023.01)
(Continued)

(52) U.S. Cl.
CPC ....... H10K 59/879 (2023.02); H10K 59/1201 (2023.02); H10K 59/50 (2023.02); H10K 59/878 (2023.02); H10K 2102/351 (2023.02)

(58) Field of Classification Search
CPC .. H10K 59/50; H10K 59/1201; H10K 59/878; H10K 2102/351
See application file for complete search history.

(56) References Cited

U.S. PATENT DOCUMENTS 6,111,270 A 8/2000 Ku et al.
9,893,251 B2 * 2/2018 Kim ........................ H01L 33/32
(Continued)

FOREIGN PATENT DOCUMENTS

CN 101889305 A 11/2010
CN 208737792 U 4/2019
(Continued)

*Primary Examiner* — Eugene Lee
(74) *Attorney, Agent, or Firm* — WHDA, LLP

(57) ABSTRACT

A display substrate is provided. The display substrate includes: a base substrate; a light-emitting unit layer arranged on the base substrate, wherein the light-emitting unit layer includes a plurality of light-emitting units respectively emitting light of a plurality of colors; and a light modulation layer located on a side of the light-emitting unit layer away from the base substrate, and configured to transmit a part of the light emitted from the plurality of light-emitting units and reflect the other part of the light emitted from the plurality of light-emitting units; wherein the light modulation layer is configured such that a reflectivity of the light modulation layer to light in a first wavelength range is greater than that of the light modulation layer to light outside the first wavelength range, and the first wavelength range is within a wavelength range of visible light and is 500 nm or more.

11 Claims, 5 Drawing Sheets

(51) Int. Cl.
   H10K 59/50 (2023.01)
   H10K 102/00 (2023.01)

(56) References Cited

U.S. PATENT DOCUMENTS

| | | | |
|---|---|---|---|
| 11,048,115 B2 | 6/2021 | Niiyama | |
| 2003/0052869 A1 | 3/2003 | Fujii et al. | |
| 2008/0042553 A1 | 2/2008 | Li | |
| 2010/0309096 A1 | 12/2010 | Inoh | |
| 2011/0198644 A1* | 8/2011 | Hwang | H01L 33/44 |
| | | | 257/E33.056 |
| 2014/0167599 A1* | 6/2014 | Sugiura | H05B 33/14 |
| | | | 313/498 |
| 2015/0085223 A1* | 3/2015 | Park | G02F 1/133615 |
| | | | 349/65 |
| 2016/0087159 A1* | 3/2016 | Kim | H01L 33/46 |
| | | | 257/98 |
| 2017/0062680 A1* | 3/2017 | Yoo | H01L 33/06 |
| 2017/0133357 A1* | 5/2017 | Kuo | H01L 25/167 |
| 2019/0280050 A1* | 9/2019 | Chaji | H10K 59/121 |
| 2020/0075683 A1* | 3/2020 | Polyakov | G06F 3/0416 |
| 2020/0144333 A1* | 5/2020 | Kim | H01L 31/035218 |
| 2021/0005797 A1* | 1/2021 | Kang | H01L 33/60 |
| 2021/0036062 A1* | 2/2021 | Kim | H10K 59/126 |
| 2022/0255046 A1 | 8/2022 | Fang et al. | |

FOREIGN PATENT DOCUMENTS

| | | |
|---|---|---|
| CN | 109785748 A | 5/2019 |
| CN | 110379940 A | 10/2019 |
| CN | 111477674 A | 7/2020 |
| CN | 111900189 A | 11/2020 |
| CN | 111900190 A | 11/2020 |
| KR | 101958721 B1 | 3/2019 |

* cited by examiner

30

Wavelength

30'

DISPLAY SUBSTRATE AND MANUFACTURING METHOD THEREOF, DISPLAY DEVICE, WEARABLE DEVICE, AND DISPLAY METHOD

CROSS REFERENCE TO RELATED APPLICATION(S)

This application is a Section 371 National Stage Application of International Application No. PCT/CN2021/082160 filed on Mar. 20, 2021, entitled "DISPLAY SUBSTRATE AND MANUFACTURING METHOD THEREOF, DISPLAY DEVICE, WEARABLE DEVICE, AND DISPLAY METHOD", which is incorporated herein by reference in its entirety.

TECHNICAL FIELD

The present disclosure relates to a field of a display technology, in particular to a display substrate and a manufacturing method thereof, a display device, a wearable device, and a display method.

BACKGROUND

With a development of the display technology, display devices with multiple functions are constantly emerging, and there are more and more requirements for a display effect. For example, for a display device of a wearable device, in order to match some designs of the wearable device, the display device needs to exhibits a color matching the designs. For example, the entire display device needs to present red, yellow, green or other colors. By contrast, display devices in a related art generally present dark gray or dark black, which may not meet a requirement of brilliant colors of the display device in some designs. In addition, a problem of color deviation may exist in a color display of a display device. How to make a display device body present diverse color and solve the problem of color deviation in the color display of the display device has become an important topic for R&D personnel.

The above information disclosed in this section is only for the understanding of the background of the inventive concept of the present disclosure. Therefore, the above information may include information that does not constitute the prior art.

SUMMARY

In an aspect, there is provided a display substrate, including: a base substrate; a light-emitting unit layer arranged on the base substrate, wherein the light-emitting unit layer includes a plurality of light-emitting units respectively emitting light of a plurality of colors; and a light modulation layer located on a side of the light-emitting unit layer away from the base substrate, and configured to transmit a part of the light emitted from the plurality of light-emitting units and reflect the other part of the light emitted from the plurality of light-emitting units; wherein the light modulation layer is configured such that a reflectivity of the light modulation layer to light in a first wavelength range is greater than that of the light modulation layer to light outside the first wavelength range, and the first wavelength range is within a wavelength range of visible light and is 500 nm or more.

According to some exemplary embodiments, the light modulation layer includes an odd number of sub-layers arranged in stack, and the odd number is 3 or more; and the odd number of sub-layers include a first sub-layer having a first refractive index and a second sub-layer having a second refractive index, the first sub-layer and the second sub-layer are alternately arranged, and the first refractive index is greater than the second refractive index.

According to some exemplary embodiments, the first refractive index is in a range of 1.6 to 2.5, and the second refractive index is in a range of 1.3 to 1.5.

According to some exemplary embodiments, the first sub-layer contains silicon nitride, and the second sub-layer contains silicon oxide.

According to some exemplary embodiments, a thickness of the first sub-layer is in a range of 210 nm to 230 nm, a thickness of the second sub-layer is in a range of 70 nm to 90 nm, and the first wavelength range is 500 nm to 600 nm; or the thickness of the first sub-layer is in a range of 230 nm to 250 nm, the thickness of the second sub-layer is in a range of 110 nm to 130 nm, and the first wavelength range is 600 nm to 760 nm; or the thickness of the first sub-layer is in a range of 90 nm to 110 nm, the thickness of the second sub-layer is in a range of 65 nm to 85 nm, and the first wavelength range is 580 nm to 630 nm; or the thickness of the first sub-layer is in a range of 130 nm to 150 nm, the thickness of the second sub-layer is in a range of 240 nm to 260 nm, and the first wavelength range is 630 nm to 670 nm.

According to some exemplary embodiments, the first sub-layer contains titanium oxide, and the second sub-layer contains silicon oxide.

According to some exemplary embodiments, the thickness of the first sub-layer is in a range of 80 nm to 100 nm, the thickness of the second sub-layer is in a range of 85 nm to 105 nm, and the first wavelength range is 500 nm to 600 nm; or the thickness of the first sub-layer is in a range of 110 nm to 130 nm, the thickness of the second sub-layer is in a range of 85 nm to 105 nm, and the first wavelength range is 600 nm to 760 nm.

According to some exemplary embodiments, the light modulation layer includes five sub-layers, and the five sub-layers include three first sub-layers and two second sub-layers.

According to some exemplary embodiments, the display substrate further includes a reflective layer located between the light-emitting unit layer and the light modulation layer, the reflective layer is provided with a plurality of light-transmitting holes, orthographic projections of the plurality of light-transmitting holes on the base substrate respectively overlap orthographic projections of the plurality of light-emitting units on the base substrate, and the reflective layer is configured to reflect most of light incident on the reflective layer.

According to some exemplary embodiments, the light-emitting unit of the light-emitting unit layer is configured to emit light in a second wavelength range complementary to the light in the first wavelength range.

In another aspect, there is further provided a display device including the display substrate described above.

In another aspect, there is further provided a wearable device including the display substrate described above.

In yet another aspect, there is further provided a method of manufacturing a display substrate, including: forming a base substrate; forming a light-emitting unit layer on the base substrate, wherein the light-emitting unit layer includes a plurality of light-emitting units respectively emitting light of a plurality of colors; and forming a light modulation layer on a side of the light-emitting unit layer away from the base substrate, wherein the light modulation layer is configured to transmit a part of the light emitted from the plurality of light-emitting units and reflect the other part of the light emitted from the plurality of light-emitting units; wherein the light modulation layer is configured such that a reflectivity of the light modulation layer to light in a first wavelength range is greater than that of the light modulation layer to light outside the first wavelength range, and the first wavelength range is within a wavelength range of visible light and is 500 nm or more.

According to some exemplary embodiments, the forming a light modulation layer includes: forming an odd number of sub-layers stacked on a side of the light-emitting unit layer away from the base substrate, wherein the odd number is 3 or more; and the odd number of sub-layers include a first sub-layer having a first refractive index and a second sub-layer having a second refractive index, the first sub-layer and the second sub-layer are alternately arranged when formed, and the first refractive index is greater than the second refractive index.

According to some exemplary embodiments, the first sub-layer is formed of a silicon nitride material, and the second sub-layer is formed of a silicon oxide material.

According to some exemplary embodiments, the first sub-layer is formed with a thickness in a range of 210 nm to 230 nm, and the second sub-layer is formed with a thickness in a range of 70 nm to 90 nm; or the first sub-layer is formed with a thickness in a range of 230 nm to 250 nm, and the second sub-layer is formed with a thickness in a range of 110 nm to 130 nm; or the first sub-layer is formed with a thickness in a range of 90 nm to 110 nm, and the second sub-layer is formed with a thickness in a range of 65 nm to 85 nm; or the first sub-layer is formed with a thickness in a range of 130 nm to 150 nm, and the second sub-layer is formed with a thickness in a range of 240 nm to 260 nm.

According to some exemplary embodiments, the first sub-layer is formed of a titanium oxide material, and the second sub-layer is formed of a silicon oxide material.

According to some exemplary embodiments, the first sub-layer is formed with a thickness in a range of 80 nm to 100 nm, and the second sub-layer is formed with a thickness in a range of 85 nm to 105 nm; or the first sub-layer is formed with a thickness in a range of 110 nm to 130 nm, and the second sub-layer is formed with a thickness in a range of 85 nm to 105 nm.

According to some exemplary embodiments, the method of manufacturing the display substrate further includes: subsequent to forming the light-emitting unit layer and prior to forming the light modulation layer, forming a reflective layer on a side of the light-emitting unit layer away from the base substrate; wherein the reflective layer is provided with a plurality of light-transmitting holes, orthographic projections of the plurality of light-transmitting holes on the base substrate respectively overlap orthographic projections of the plurality of light-emitting units on the base substrate, and the reflective layer is configured to reflect most of light incident on the reflective layer.

In another aspect, there is further provided a method of displaying by the display device described above, including: emitting, by a light-emitting unit of a light-emitting unit layer, light in a second wavelength range for display; transmitting most of the light in the second wavelength range through a light modulation layer; and reflecting, by the light modulation layer, most of light in a first wavelength range complementary to the light in the second wavelength range, wherein the light modulation layer exhibits a color corresponding to the light in the first wavelength range, so that a color of the light in the second wavelength range emitted by the light-emitting unit layer and the color exhibited by the light modulation layer have a larger color gamut range.

BRIEF DESCRIPTION OF DRAWINGS

The features and advantages of the present disclosure will become more apparent by describing in detail exemplary embodiments of the present disclosure with reference to the drawings.

DETAILED DESCRIPTION

Figure 1:
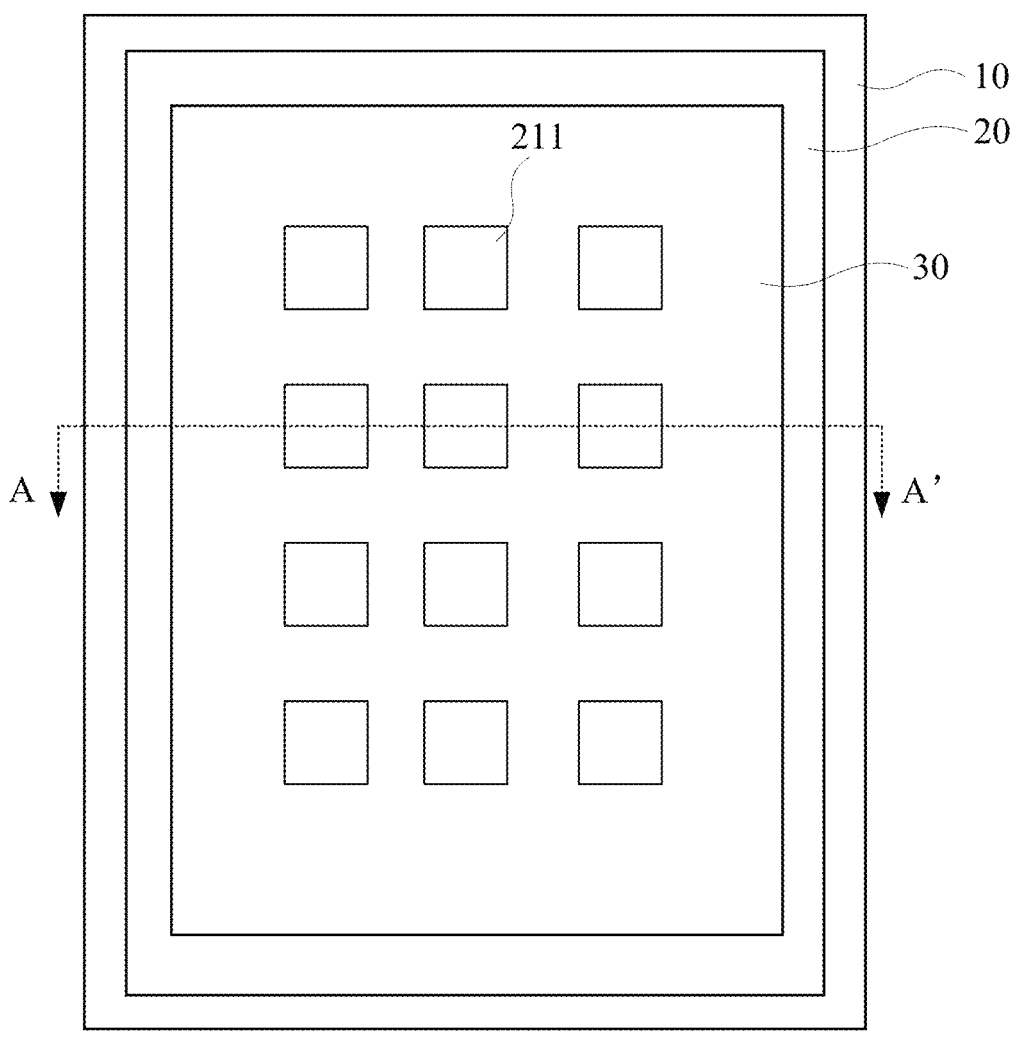
FIG. 1 shows a plan view of a display substrate according to the exemplary embodiments of the present disclosure.

In order to make the objectives, technical solutions and advantages of the present disclosure more clear, the technical solutions of the embodiments of the present disclosure are clearly and completely described below with reference to the drawings. Obviously, the described embodiments are only a part rather than all of the embodiments of the present disclosure. Based on the embodiments of the present disclosure, all other embodiments obtained by those of ordinary skilled in the art without carrying out inventive effort fall within the scope of protection of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be provided. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connection" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Therefore, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", etc. may be used herein to describe a relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

It should be noted that the expression "complementary lights" herein may mean a colored light in optical three primary colored lights and a colored light other than the three primary colored lights that may be added in equal amounts to form white light, which may also be called complementary colored lights. A mutual blocking effect may be formed between the complementary lights. For example, the complementary lights may be yellow light and blue light, red light and cyan light, green light and magenta light.

Herein, the expression "distribution density of light-emitting units" means a number of light-emitting units per unit area. Similarly, the expression "distribution density" refers to a number of components (e.g., repetitive units, sub-pixels, light-emitting units, etc.) per unit area.

Figure 2:
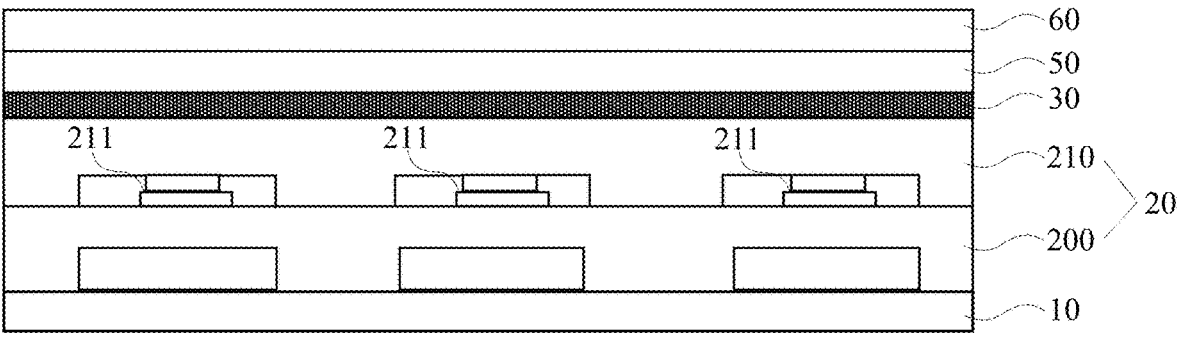
FIG. 2 shows a cross-sectional view of the display substrate taken along line A-A' of FIG. 1 according to some exemplary embodiments of the present disclosure.
Figure 3:
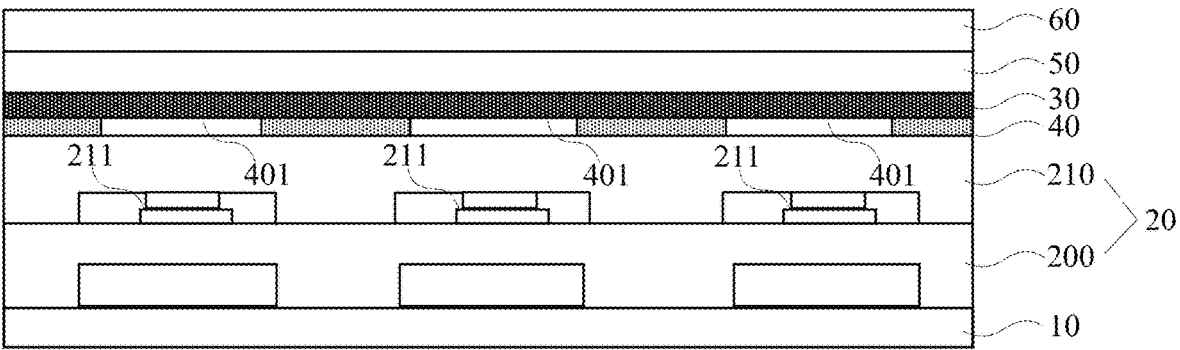
FIG. 3 shows a cross-sectional view of the display substrate taken along line A-A' of FIG. 1 according to other exemplary embodiments of the present disclosure.

FIG. 1 schematically shows a plan view of a display substrate according to the exemplary embodiments of the present disclosure. FIG. 2 shows a cross-sectional view of the display substrate taken along line A-A' of FIG. 1 according to an exemplary embodiment of the present disclosure. FIG. 3 shows a cross-sectional view of the display substrate taken along line A-A' of FIG. 1 according to another exemplary embodiment of the present disclosure.

FIG. 1 and FIG. 2 illustrate a structure of an OLED display substrate. As shown in FIG. 1 and FIG. 2, in the exemplary embodiments, the display substrate includes a base substrate 10, a light-emitting unit layer 20 located on the base substrate 10, a light modulation layer 30 located on a side of the light-emitting unit layer 20 away from the base substrate 10, an optical adhesive layer 50 located on a side of the light modulation layer 30 away from the base substrate 10, and a cover layer 60 arranged on a surface of the optical adhesive layer 50 on a side away from the base substrate 10.

Optionally, as shown in FIG. 3, the display substrate may further include a reflective layer 40 located between the light-emitting unit layer 20 and the light modulation layer 30.

The light-emitting unit layer 20 includes a driving structure layer 200 and a light-emitting structure layer 210 located on a side of the driving structure layer 200 away from the base substrate 10.

In the exemplary embodiments of the present disclosure, the driving structure layer 200 may include a plurality of thin film transistors and storage capacitors that form a pixel driving circuit. In the exemplary embodiments, the driving structure layer 200 may include, for example, a first insulating layer, a semiconductor layer, a second insulating layer, a first gate metal layer, a third insulating layer, a second gate metal layer, a fourth insulating layer, a source/drain metal layer and a planarization layer sequentially arranged on the base substrate 10.

On a plane parallel to the base substrate 10, the light-emitting structure layer 210 includes a plurality of periodically arranged light-emitting units 211 corresponding to different colors. In the exemplary embodiments, the plurality of light-emitting units 211 may include a red light-emitting unit emitting a red light, a green light-emitting unit emitting a green light, and a blue light-emitting unit emitting a blue light. In some possible implementations, the plurality of light-emitting units may include a red light-emitting unit, a green light-emitting unit, a blue light-emitting unit, and a white light-emitting unit emitting a white light. A distribution density of the light-emitting units 211 may be set according to a usage requirement.

In the exemplary embodiments, the light-emitting structure layer 210 may include an anode, a pixel defining layer, an organic light-emitting layer, a cathode, and a packaging structure layer.

In the exemplary embodiments, the light modulation layer is used to transmit a part of the light emitted from the plurality of light-emitting units and reflect the other part of the light emitted from the plurality of light-emitting units. The light modulation layer is configured such that a reflectivity of the light modulation layer to light in a first wavelength range is greater than that of the light modulation layer to light outside the first wavelength range. The first wavelength range is within a wavelength range of visible light and is 500 nm or more.

According to the embodiments of the present disclosure, the light modulation layer may transmit the light emitted from the plurality of light-emitting units, that is, it may transmit a part of the light emitted from the light-emitting units without affecting a light-emitting effect of the light-emitting units. The light modulation layer may reflect the other part of the light emitted from the plurality of light-emitting units. For example, the light modulation layer may reflect not only the light emitted by the light-emitting units, but also a natural light in an environment. Therefore, in a natural light environment, the light modulation layer exhibits a color of the reflected natural light, so that the display substrate presents the color of the reflected natural light.

In the exemplary embodiments, the light modulation layer 30 includes an odd number of sub-layers arranged in stack, and the odd number is 3 or more. The odd number of sub-layers may include a first sub-layer having a first refractive index and a second sub-layer having a second refractive index, the first sub-layer and the second sub-layer are alternately arranged, and the first refractive index is greater than the second refractive index. For example, the number of sub-layers may be 3, 5, or 7, etc.

In the exemplary embodiments, the first refractive index is in a range of 1.6 to 2.5, and the second refractive index is in a range of 1.3 to 1.5.

The reflective layer 40 is provided with a plurality of light-transmitting holes 401. Orthographic projections of the plurality of light-transmitting holes 401 on the base substrate 10 respectively overlap orthographic projections of the plurality of light-emitting units 20 on the base substrate 10. For example, the orthographic projections of the light-transmitting holes 401 on the base substrate 10 may partially overlap or completely overlap the orthographic projections of the plurality of light-emitting units 20 on the base substrate 10. The reflective layer 40 is used to reflect most of the light incident on the reflective layer 40.

In the exemplary embodiments, the light modulation layer of the present disclosure is a periodic multilayer film system, a basic structure of which is a periodic multilayer film system $(LH)^S$, and a $\lambda/8$ film layer is added on each side of the multilayer film system $(LH)^S$ to form a $(0.5HL0.5H)^S$ periodic multilayer film system, that is, $$\left(\frac{H}{2}L\frac{H}{2}\right)^S,$$

where H represents the first sub-layer having the first refractive index, L represents the second sub-layer having the second refractive index, the first refractive index is greater than the second refractive index, S=1, 2, 3, . . . , N, is a period number of the multilayer film system. For example, the $(0.5HL0.5H)$ periodic multilayer film system has three layers, which include alternately stacked first sub-layer and second sub-layer. That is, the first sub-layer, the second sub-layer layer and the first sub-layer are arranged in this order. For another example, a $(0.5HL0.5H)^2$ periodic multilayer film system has five layers, which include alternately stacked first sub-layers and second sub-layers. That is, the first sub-layer, the second sub-layer, the first sub-layer, the second sub-layer and the first sub-layer are arranged in this order.

In the $(0.5HL0.5H)^S$ periodic multilayer film system, a principle of multi-beam interference is used to allow a light beam in a certain wavelength range (band) to be highly reflected and allow a light beam deviating from this wavelength range (band) to be highly transmitted, and a basic feature is that a series of high-reflection layers are separated by a series of high-transmittance layers. In the exemplary embodiments, S=1~10 is set in consideration of a thickness, a preparation time and a process implementation of the light modulation layer.

In the exemplary embodiments, the light modulation layer includes an odd number of sub-layers arranged in stack, and the odd number is 3 or more, such as 3, 5, 7, 9, etc.

In a possible exemplary embodiment, the first sub-layer contains silicon nitride, and the second sub-layer contains silicon oxide. A thickness of the first sub-layer is in a range of 210 nm to 230 nm, and a thickness of the second sub-layer is in a range of 70 nm to 90 nm.

In a possible exemplary embodiment, the first sub-layer contains silicon nitride, and the second sub-layer contains silicon oxide. The thickness of the first sub-layer is in a range of 230 nm to 250 nm, and the thickness of the second sub-layer is in a range of 110 nm to 130 nm.

In a possible exemplary embodiment, the first sub-layer contains silicon nitride, and the second sub-layer contains silicon oxide. The thickness of the first sub-layer is in a range of 90 nm to 110 nm, and the thickness of the second sub-layer is in a range of 65 nm to 85 nm.

In a possible exemplary embodiment, the first sub-layer contains silicon nitride, and the second sub-layer contains silicon oxide. The thickness of the first sub-layer is in a range of 130 nm to 150 nm, and the thickness of the second sub-layer is in a range of 240 nm to 260 nm.

In a possible exemplary embodiment, the first sub-layer contains titanium oxide, and the second sub-layer contains silicon oxide. The thickness of the first sub-layer is in a range of 80 nm to 100 nm, and the thickness of the second sub-layer is in a range of 85 nm to 105 nm.

In a possible exemplary embodiment, the first sub-layer contains titanium oxide, and the second sub-layer contains silicon oxide. The thickness of the first sub-layer is in a range of 110 nm to 130 nm, and the thickness of the second sub-layer is in a range of 85 nm to 105 nm.

Figure 4:
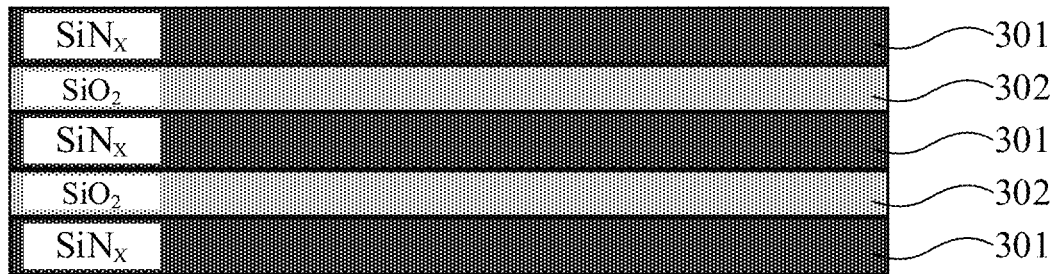
FIG. 4 shows a cross-sectional view of a light modulation layer of a display substrate according to some exemplary embodiments of the present disclosure.

FIG. 4 shows a cross-sectional view of the light modulation layer of the display substrate according to some exemplary embodiments of the present disclosure.

Figure 5:
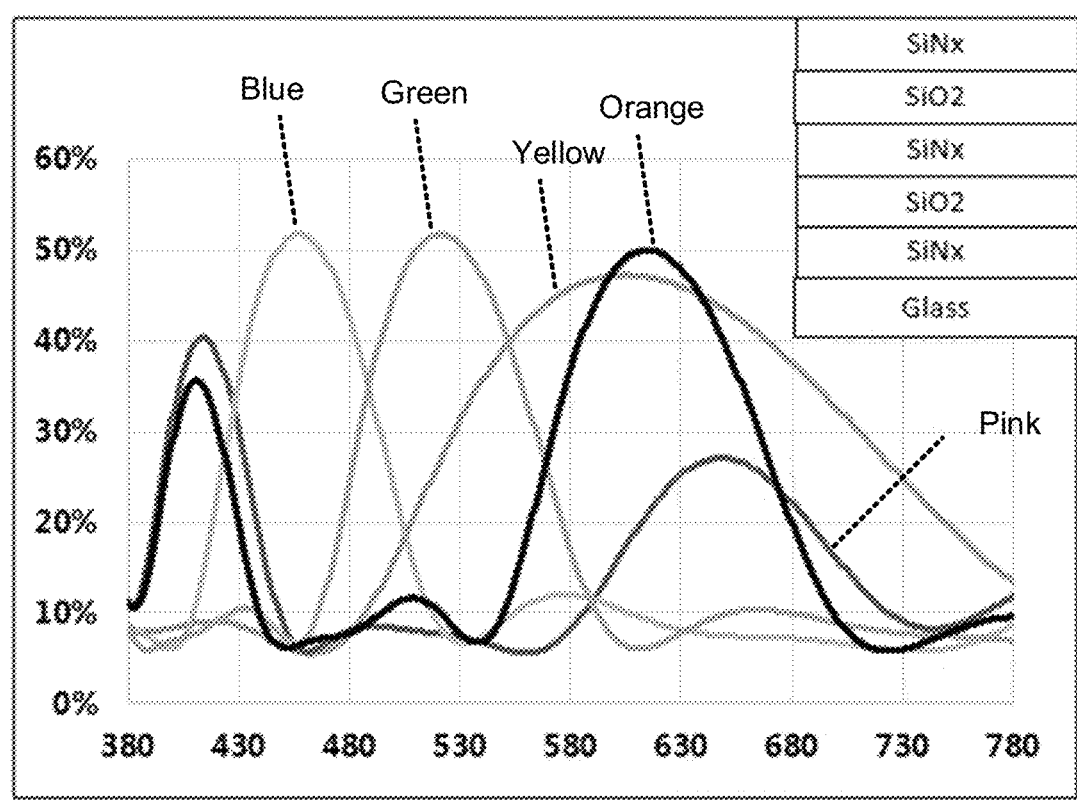
FIG. 5 shows a reflection graph of a light modulation layer of a display substrate according to some exemplary embodiments of the present disclosure.

FIG. 5 shows a reflection graph of the light modulation layer of the display substrate according to some exemplary embodiments of the present disclosure.

In some embodiments, as shown in FIG. 4, the light modulation layer 30 includes a first sub-layer 301 and a second sub-layer 302. The first sub-layer 301 contains silicon nitride, and the second sub-layer 302 contains silicon oxide. The light modulation layer 30 may include five sub-layers, including the first sub-layer 301, the second sub-layer 302, the first sub-layer 301, the second sub-layer 302 and the first sub-layer 301 arranged in this order.

FIG. 5 shows a simulation result for a light modulation layer including 5 sub-layers at a viewing angle of 8 degrees, where the abscissa is a wavelength and the ordinate is a reflectivity. Table 1 shows a color exhibited by the light reflected by the light modulation layer with different sub-layer thickness, and Table 2 shows reflectivity and transmittance of the light modulation layer with different sub-layer thickness to the light in each wavelength range. In the exemplary embodiments of the present disclosure, the viewing angle refers to an angle between an eye sight line and a normal direction of the display substrate. FIG. 5 and Table 1 show a relationship of the reflectivity of the light modulation layer of the five sub-layer structure in this embodiment to the light in different wavelength range in a case of the thickness of the first sub-layer and the thickness of the second sub-layer in different ranges.

TABLE 1

Color exhibited by light reflected by light modulation layer
with different sub-layer thickness in some embodiments Sub-layers of the light modulation layer (thickness unit: nm)

| CG | First sub-layer SiNx | Second sub-layer SiO₂ | First sub-layer SiNx | Second sub-layer SiO₂ | First sub-layer SiNx | Color |
|---|---|---|---|---|---|---|
| 0.05 mm | 100 | 75 | 100 | 75 | 100 | Yellow |
| | 245 | 115 | 245 | 115 | 245 | Orange |
| | 140 | 250 | 140 | 250 | 140 | Pink |
| | 210 | 90 | 210 | 90 | 210 | Green |

TABLE 2

Reflectivity and transmittance of light modulation layer with different sub-layer
thickness to light in each wavelength range in some embodiments

| Thickness of first sub-layer | Thickness of second sub-layer | Total reflectivity/transmittance | | Reflectivity to light in each wavelength range | |
|---|---|---|---|---|---|
| SiNx | SiO$_2$ | R | T | 500-600 nm | 600-760 nm |
| 220 nm | 80 nm | 0.17 | 0.82 | 0.38 | 0.09 |
| 240 nm | 120 nm | 0.19 | 0.80 | 0.22 | 0.24 |

The graph of FIG. 5 is obtained by simulating the light modulation layer with different sub-layer thickness. As shown in the curve in FIG. 5 obtained from the simulation, in a case of the thickness of the first sub-layer in a range of 90 nm to 110 nm and the thickness of the second sub-layer in a range of 65 nm to 85 nm, the reflectivity to the light in the first wavelength range of 580 nm to 630 nm is greater than that to the light outside the first wavelength range. For example, as shown in FIG. 5, when the thickness of the first sub-layer is 100 nm and the thickness of the second sub-layer is 75 nm (the light modulation layer is yellow), the light modulation layer has a relatively high reflectivity to the light within the first wavelength range of 580 nm to 630.

In a case of the thickness of the first sub-layer in a range of 130 nm to 150 nm and the thickness of the second sub-layer in a range of 240 nm to 260 nm, the reflectivity to the light in the first wavelength range of 630 nm to 670 nm is greater than that to the light outside the first wavelength range. For example, as shown in FIG. 5, when the thickness of the first sub-layer is 140 nm and the thickness of the second sub-layer is 250 nm (the light modulation layer is pink), the light modulation layer has a relatively high reflectivity to the light in the first wavelength range of 630 nm to 670 nm.

In a case of the thickness of the first sub-layer in a range of 230 nm to 250 nm and the thickness of the second sub-layer in a range of 110 nm to 130 nm, the reflectivity to the light in the first wavelength range of 600 nm to 760 nm is greater than that to the light outside the first wavelength range. For example, as shown in FIG. 5, when the thickness of the first sub-layer is 245 nm and the thickness of the second sub-layer is 115 nm (the light modulation layer is orange), the light modulation layer has a relatively high reflectivity to the light in the first wavelength range of 600 nm to 650 nm. As shown in Table 2, when the thickness of the first sub-layer is 240 nm and the thickness of the second sub-layer is 120 nm (the light modulation layer is orange), the reflectivity to the light in the first wavelength range of 500 nm to 600 nm is 22%, and the reflectivity to the light in the first wavelength range of 600 nm to 760 nm is 24%. By comparing the two, the light modulation layer has a relatively high reflectivity to the light in the first wavelength range of 600 nm to 760 nm.

In a case of the thickness of the first sub-layer in a range of 210 nm to 230 nm and the thickness of the second sub-layer in a range of 70 nm to 90 nm, the reflectivity to the light in the first wavelength range of 500 nm to 600 nm is greater than that to the light outside the first wavelength range. For example, as shown in FIG. 5, when the thickness of the first sub-layer is 210 nm and the thickness of the second sub-layer is 90 nm (the light modulation layer is green), the light modulation layer has a relatively high reflectivity to the light in the first wavelength range of 500 nm to 560 nm. As shown in Table 2, when the thickness of the first sub-layer is 220 nm and the thickness of the second sub-layer is 80 nm (the light modulation layer is green), the reflectivity to the light in the first wavelength range of 500 nm to 600 nm is 38%, and the reflectivity to the light in the first wavelength range of 600 nm to 760 nm is 9%. By comparing the two, the light modulation layer has a relatively high reflectivity to the light in the first wavelength range of 500 nm to 600 nm.

Figure 6:
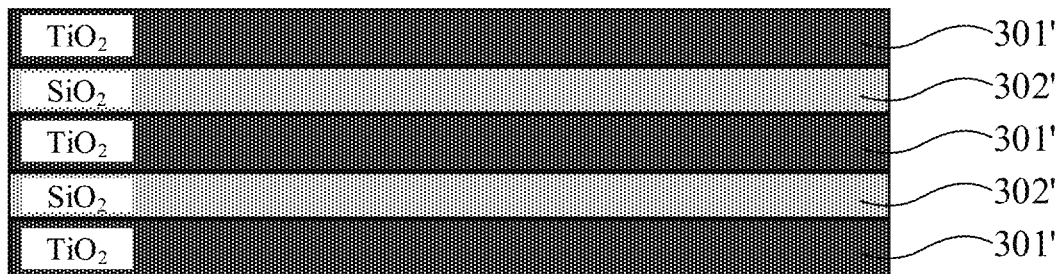
FIG. 6 shows a cross-sectional view of a light modulation layer of a display substrate according to other exemplary embodiments of the present disclosure.

FIG. 6 shows a cross-sectional view of the light modulation layer of the display substrate according to some exemplary embodiments of the present disclosure.

Figure 7:
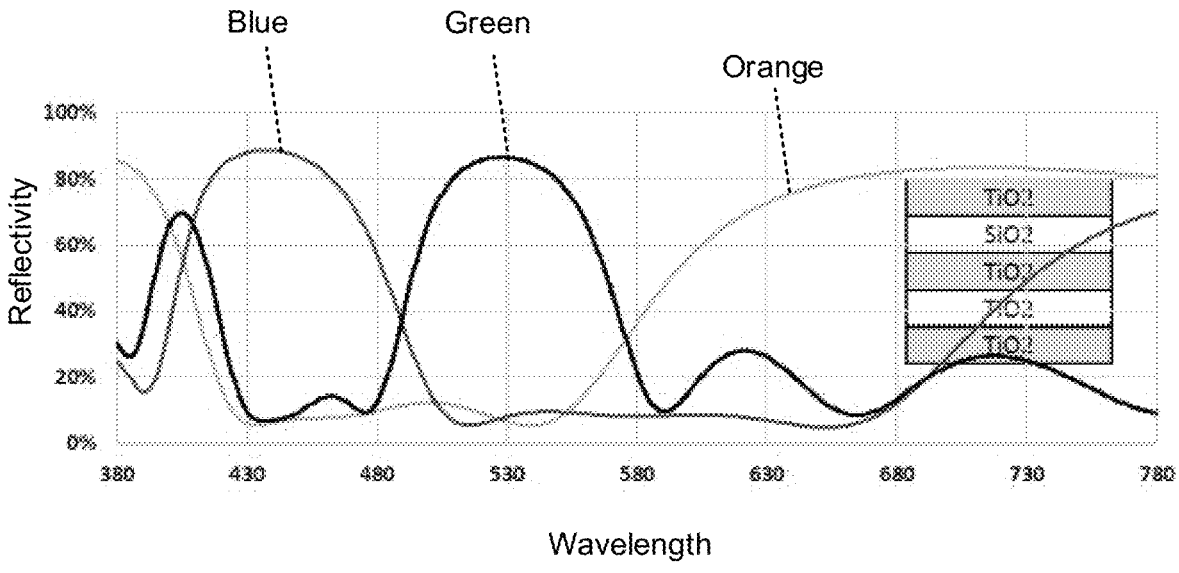
FIG. 7 shows a reflection graph of a light modulation layer of a display substrate according to other exemplary embodiments of the present disclosure.

FIG. 7 shows a reflection graph of the light modulation layer of the display substrate according to some exemplary embodiments of the present disclosure.

In some embodiments, as shown in FIG. 6, a light modulation layer 30' includes a first sub-layer 301' and a second sub-layer 302'. The first sub-layer 301' contains titanium oxide, and the second sub-layer 302' contains silicon oxide. The light modulation layer 30' may include five sub-layers, where the first sub-layer 301', the second sub-layer 302', the first sub-layer 301', the second sub-layer 302' and the first sub-layer 301' are arranged in this order.

FIG. 7 shows a simulation result for a light modulation layer including 5 sub-layers at a viewing angle of 8 degrees, where the abscissa is a wavelength and the ordinate is a reflectivity. Table 3 shows the reflectivity and transmittance of the light modulation layer with different sub-layer thickness to the light in each wavelength range.

TABLE 3

Reflectivity and transmittance of light modulation layer with different sub-layer
thickness to light in each wavelength range in some embodiments

| Thickness of first sub-layer | Thickness of second sub-layer | Total reflectivity/transmittance | | Reflectivity to light in each wavelength range | |
|---|---|---|---|---|---|
| TiO$_2$ | SiO$_2$ | R | T | 500-600 nm | 600-760 nm |
| 120 nm | 95 nm | 0.33 | 0.66 | 0.24 | 0.32 |
| 90 nm | 95 nm | 0.48 | 0.52 | 0.78 | 0.45 |

The graph of FIG. 7 is obtained by simulating the light modulation layer with different sub-layer thickness. As shown in the curve in FIG. 7 obtained from the simulation, in a case of the thickness of the first sub-layer in a range of 80 nm to 100 nm and the thickness of the second sub-layer in a range of 85 nm to 105 nm, the reflectivity to the light in the first wavelength range of 500 nm to 600 nm is greater than that to the light outside the first wavelength range. For example, as shown in FIG. 7, when the thickness of the first sub-layer is in the range of 80 nm to 100 nm and the thickness of the second sub-layer is in the range of 85 nm to 105 nm (the light modulation layer is green), the light modulation layer has a relatively high reflectivity to the light within the first wavelength range of 500 nm to 560. As shown in Table 3, when the thickness of the first sub-layer is 90 nm and the thickness of the second sub-layer is 95 nm (the light modulation layer is green), the reflectivity to the light in the first wavelength range of 500 nm to 600 nm is 78%, and the reflectivity to the light in the first wavelength range of 600 nm to 760 nm is 45%. By comparing the two, the light modulation layer has a relatively high reflectivity to the light in the first wavelength range of 500 nm to 600 nm.

In a case of the thickness of the first sub-layer in a range of 110 nm to 130 nm and the thickness of the second sub-layer in a range of 85 nm to 105 nm, the reflectivity to the light in the first wavelength range of 600 nm to 760 nm is greater than that to the light outside the first wavelength range. For example, as shown in FIG. 7, when the thickness of the first sub-layer is in a range of 110 nm to 130 nm and the thickness of the second sub-layer is in a range of 85 nm to 105 nm (the light modulation layer is orange), the light modulation layer has a relatively high reflectivity to the light within the first wavelength range of 600 nm to 760. As shown in Table 3, when the thickness of the first sub-layer is 120 nm and the thickness of the second sub-layer is 95 nm (the light modulation layer is orange), the reflectivity to the light in the first wavelength range of 500 nm to 600 nm is 24%, and the reflectivity to the light in the first wavelength range of 600 nm to 760 nm is 32%. By comparing the two, the light modulation layer has a relatively high reflectivity to the light in the first wavelength range of 600 nm to 760 nm.

In the exemplary embodiments of the present disclosure, the light-emitting unit of the light-emitting unit layer is configured to emit light in a second wavelength range, which is complementary to the light in the first wavelength range.

According to the embodiments of the present disclosure, the light-emitting unit emits the light in the second wavelength range, which is complementary to the light in the first wavelength range reflected by the light modulation layer. Therefore, most of the light in the second wavelength range emitted by the light-emitting unit may be transmitted through the light modulation layer, and the light modulation layer reflects the light in the first wavelength range in the environment, so that the color of the light emitted by the light-emitting unit and the color of the light reflected by the light modulation layer have a larger color gamut range. With this arrangement, the display substrate may have a stronger display effect, and a shortcoming of color deviation may be effectively compensated.

The exemplary embodiments of the present disclosure further provide a method of manufacturing a display substrate, which is exemplarily described below. For a metal material, an inorganic material or a transparent conductive material, the "patterning process" mentioned in the present disclosure includes coating with photoresist, mask exposure, development, etching, stripping photoresist and other treatments. For an organic material, the "patterning process"

includes coating with organic material, mask exposure, development and other treatments. Deposition may be performed using any one or more of sputtering, evaporation, chemical vapor deposition, coating may be performed using any one or more of spraying, spin coating and inkjet printing, and etching may be performed using any one or more of dry etching and wet etching, which are not limited in the present disclosure. "Thin film" refers to a layer of thin film made of a certain material on a base substrate by deposition or other processes. If the "thin film" does not require a patterning process during the entire manufacturing process, the "thin film" may also be referred to as a "layer". If the "thin film" needs a patterning process in the manufacturing process, it is referred to as a "thin film" prior to the patterning process and as a "layer" subsequent to the patterning process. The "layer" subsequent to the patterning process contains at least one "pattern". In the present disclosure, "A and B are arranged in the same layer" means that A and B are simultaneously formed by the same patterning process. The "thickness" of the film layer is a size of the film layer in a direction perpendicular to the display substrate. In the exemplary embodiments of the present disclosure, "an orthographic projection of A overlaps an orthographic projection of B" means that a boundary of the orthographic projection of B falls within a boundary range of the orthographic projection of A, or a boundary of the orthographic projection of A falls within a boundary range of the orthographic projection of B, or the boundary of the orthographic projection of A overlaps the boundary of the orthographic projection of B, or the orthographic projection of A and the orthographic projection of B have an overlapping region.

Figure 8:
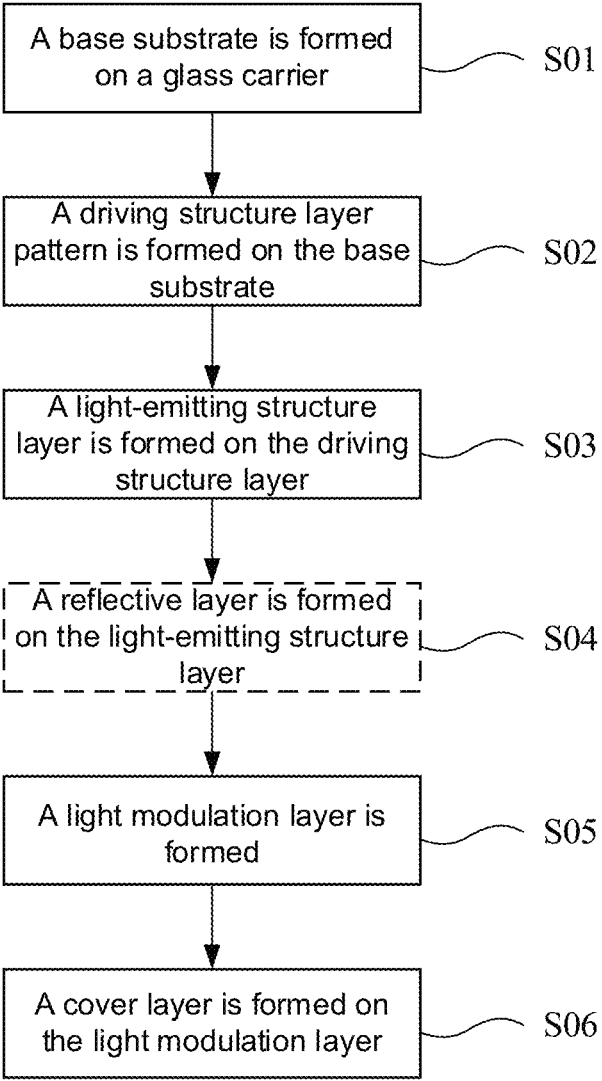
FIG. 8 shows a flowchart of a method of manufacturing a display substrate according to the exemplary embodiments of the present disclosure.

FIG. 8 shows a flowchart of a method of manufacturing a display substrate according to the exemplary embodiments of the present disclosure.

In an exemplary embodiment, as shown in FIG. 8, the method of manufacturing the display substrate includes step S01 to step S06.

In step S01, a base substrate 10 is formed on a glass carrier. In an exemplary embodiment, forming the base substrate 10 on the glass carrier may include: applying a first flexible material film on the glass carrier, so as to form a first flexible layer after curing into a film; applying a second flexible material film on a surface of the first flexible layer on a side away from the glass carrier, so as to form a second flexible layer after curing into a film; and applying a third flexible material film on a surface of the second flexible layer on a side away from the glass carrier, so as to form a third flexible layer after curing into a film, so that a flexible base substrate 10 including a stack of the first flexible layer, the second flexible layer and the third flexible layer is formed on the glass carrier.

In another exemplary embodiment, forming the base substrate 10 on the glass carrier may include: firstly applying a first flexible material film on the glass carrier, so as to form a first flexible layer after curing into film; then depositing a first inorganic material film on the first flexible layer, so as to form a first inorganic layer covering the first flexible layer; then depositing an amorphous silicon film on the first inorganic layer, so as to form an amorphous silicon layer covering the first inorganic layer; then applying a second flexible material film on the amorphous silicon layer, so as to form a second flexible layer after curing into a film; then depositing a second inorganic material film on the second flexible layer, so as to form a second barrier layer covering the second flexible layer, so that a flexible base substrate 10 including a stack of the first flexible layer, the first inorganic layer, the semiconductor layer, the second flexible layer and the second inorganic layer is formed on the glass carrier.

In the exemplary embodiments, a material of the first, second and third flexible material films may be polyimide (PI), polyethylene terephthalate (PET), pressure sensitive adhesive (PSA) or a surface-treated polymer soft film, etc. A material of the first and second inorganic material films may be silicon nitride (SiNx) or silicon oxide (SiOx), etc., to improve a water and oxygen resistance of the base substrate. The first and second inorganic layers are called first and second barrier layers. A material of the semiconductor layer may be amorphous silicon (a-Si).

In the exemplary embodiments, the first flexible layer, the second flexible layer and the third flexible layer may be made of the same material, or may be made of different materials. In some possible implementations, the material of the first flexible layer includes pressure-sensitive adhesive, and the material of the second flexible layer and the third flexible layer include polyimide.

In step S02, a pattern of the driving structure layer 200 is formed on the base substrate 10. In the exemplary embodiments, the driving structure layer 200 may include a plurality of transistors and storage capacitors constituting a pixel driving circuit. FIG. 3 illustrates the driving structure layer 200 of three sub-pixels, where the driving structure layer 200 of each sub-pixel including a transistor and a storage capacitor is illustrated by way of example. In the exemplary embodiments, the driving structure layer 200 may be prepared as follows.

A first insulating film and a semiconductor layer film are sequentially deposited on the base substrate 10, the semiconductor layer film is patterned by a patterning process to form a first insulating layer covering the entire base substrate 10, and a semiconductor layer pattern on the first insulating layer is set. The semiconductor layer pattern includes at least an active layer arranged in each sub-pixel. In the exemplary embodiments, this patterning process is referred to as a first patterning process.

Then, a second insulating film and a first metal film are sequentially deposited, the first metal film is patterned by a patterning process to form a second insulating layer covering the semiconductor layer pattern, and a first gate metal layer pattern on the second insulating layer is set. The first gate metal layer pattern includes at least a gate electrode and a first capacitor electrode arranged in each sub-pixel. In the exemplary embodiments, this patterning process is referred to as a second patterning process.

Then, a third insulating film and a second metal film are sequentially deposited, the second metal film is patterned by a patterning process to form a third insulating layer covering the first gate metal layer, and a second gate metal layer pattern on the third insulating layer is set. The second gate metal layer pattern includes at least a second capacitor electrode arranged in each sub-pixel, and a position of the second capacitor electrode corresponds to that of the first capacitor electrode. In the exemplary embodiments, this patterning process is referred to as a third patterning process.

Next, a fourth insulating film is deposited and patterned by a patterning process to form a fourth insulating layer pattern covering the second gate metal layer, and a plurality of via hole patterns are opened on the fourth insulating layer. The plurality of via hole patterns include at least two first via holes arranged in each sub-pixel, and positions of the two first via holes respectively correspond to both ends of the active layer. The fourth insulating layer, the third insulating layer and the second insulating layer in both first via holes are etched away to expose a surface of the active layer. In the exemplary embodiments, this patterning process is referred to as a fourth patterning process.

Subsequently, a third metal film is deposited and patterned by a patterning process, and a source/drain metal layer pattern is formed on the fourth insulating layer. The source/drain metal layer pattern includes at least a source electrode and a drain electrode arranged in each sub-pixel. The source electrode and the drain electrode are respectively connected to the active layer through the first via holes, so that a conductive channel is formed between the source electrode and the drain electrode. In the exemplary embodiments, this patterning process is referred to as a fifth patterning process.

After that, a planarization film is applied to form a planarization (PLN) layer covering the entire base substrate 10, and a via hole pattern is formed on the planarization layer by a patterning process. The via hole pattern includes at least a second via hole arranged in each sub-pixel. The first planarization layer in the second via hole is developed away to expose a surface of the drain electrode. A surface of the planarization layer on the side away from the base substrate 10 is a flat surface. In the exemplary embodiments, this patterning process is referred to as a sixth patterning process.

So far, the pattern of the driving structure layer 200 is prepared on the base substrate 10. The active layer, the gate electrode, the source electrode and the drain electrode form a transistor, and the first capacitor electrode and the second capacitor electrode form a storage capacitor. In an exemplary embodiment, the transistor may be a driving transistor in a pixel driving circuit, and the driving transistor may be a thin film transistor (TFT).

In the exemplary embodiments, the first insulating layer, the second insulating layer, the third insulating layer and the fourth insulating layer may be made of any one or more of silicon oxide (SiOx), silicon nitride (SiNx) and silicon oxynitride (SiON), and may be a single layer, a multi-layer or a composite layer. The first insulating layer is called a buffer layer, which is used to improve the water and oxygen resistance of the base substrate. The second insulating layer and the third insulating layer are called a gate insulating (GI) layer. The fourth insulating layer is called an interlayer insulating (ILD) layer. The planarization film may be made of a resin material or the like. The first metal thin film, the second metal thin film and the third metal thin film may be made of a metal material, such as any one or more of silver (Ag), copper (Cu), aluminum (Al), titanium (Ti) and molybdenum (Mo), or an alloy material of the above metals, such as aluminum neodymium alloy (AlNd) or molybdenum niobium alloy (MoNb), and may be a single-layer structure, or a multi-layer composite structure, such as Ti/Al/Ti, etc. The active layer film may be made of amorphous indium gallium zinc oxide (a-IGZO), zinc oxynitride (ZnON), indium zinc tin oxide (IZTO), amorphous silicon (a-Si), polycrystalline silicon (p-Si), hexathiophene or polythiophene. That is, the present disclosure is applicable to a transistor manufactured based on oxide technology, silicon technology or organic technology.

In step S03, a light-emitting structure layer 210 is formed on the driving structure layer 200, as shown in FIG. 3. In the exemplary embodiments, the light-emitting structure layer 210 may be formed as follows on the driving structure layer 200.

A transparent conductive film is deposited on the base substrate formed with the aforementioned pattern, and the transparent conductive film is patterned by a patterning process to form a transparent conductive layer pattern. The transparent conductive layer pattern includes at least an anode arranged in each sub-pixel, and the anode is connected to the drain electrode of the first transistor through the second via hole. In the exemplary embodiments, this patterning process is referred to as a seventh patterning process. In the exemplary embodiments, the transparent conductive film may be made of indium tin oxide (ITO) or indium zinc oxide (IZO), and may be a single-layer structure or a composite-layer structure, such as ITO/Al/ITO, etc.

A pixel defining film is applied on the base substrate formed with the aforementioned pattern. A mask exposure and a development are performed on the pixel defining film by a patterning process to form a pixel defining (PDL) layer. In each sub-pixel, the pixel defining layer is provided with a pixel opening, and the pixel defining film in the pixel opening is developed away to expose the surface of the anode. In the exemplary embodiments, this patterning process is referred to as an eighth patterning process. In the exemplary embodiments, the pixel defining film may be made of a material such as polyimide, acrylic, or polyethylene terephthalate.

An organic material thin film is applied on the base substrate formed with the aforementioned pattern, and a mask exposure and a development are performed on the organic material thin film by a patterning process to form a plurality of separation pillar (PS) patterns. In the exemplary embodiments, this patterning process is referred to as a ninth patterning process.

An organic light-emitting layer and a cathode are sequentially formed on the base substrate formed with the aforementioned patterns. In each sub-pixel, the organic light-emitting layer is formed in the pixel opening to achieve the connection between the organic light-emitting layer and the anode. The cathode is formed on the organic light-emitting layer and the pixel defining layer to achieve the connection between the cathode and the organic light-emitting layer. The cathodes of the plurality of sub-pixels are an integrated structure. In the exemplary embodiments, the organic light-emitting layer includes a stack of a hole injection layer, a hole transport layer, a light-emitting layer, an electron transport layer, and an electron injection layer.

A packaging structure layer is formed on the base substrate formed with the aforementioned pattern. In the exemplary embodiments, the packaging structure layer may have a stack structure of inorganic material/organic material/inorganic material, where the organic material layer is arranged between two inorganic material layers. In the exemplary embodiments, a process of forming the packaging structure layer may include: depositing, using an open mask, a first inorganic thin film in a display region using a plasma-enhanced chemical vapor deposition (PECVD) method, so as to form a first packaging layer. Since the open mask shields a bonding region, the first packaging layer may expose a bonding pad of the bonding region. The plasma-enhanced chemical vapor deposition is a low-temperature process, and an operating temperature is about 80 degrees. The organic material is inkjet printed on the first packaging layer in the display region using an inkjet printing process, and a second packaging layer is formed after cured into a film. Due to the inkjet printing process, the second packaging layer may be formed only in the display region. A second inorganic thin film is deposited in the display region by using an open mask, so as to form a third packaging layer. In the exemplary embodiments, the first packaging layer and the third packaging layer may be made of any one or more of silicon oxide (SiOx), silicon nitride (SiNx), and silicon oxynitride (SiON), and may be a single layer, a multi-layer or a composite layer. The second packaging layer may be made of a resin material. In the exemplary embodiments, a thickness of the first packaging layer may be approximately 0.8 μm to 1.2 μm, a thickness of the second packaging layer may be approximately 10 μm to 15 μm, and a thickness of the third packaging layer may be approximately 0.5 μm to 0.7 μm. In some possible implementations, the thickness of the first packaging layer may be approximately 1 μm, the thickness of the second packaging layer may be approximately 12 μm, and the thickness of the third packaging layer may be approximately 0.6 μm.

So far, the pattern of the light-emitting structure layer 210 is prepared on the driving structure layer 200.

In step S04, a reflective layer is formed on the light-emitting structure layer 210. Step S04 is not an essential step, it needs to be performed in a method of manufacturing a display substrate including a reflective layer, but it is not required in a method of manufacturing a display substrate without a reflective layer.

In the exemplary embodiments, forming the reflective layer 40 on the light-emitting structure layer 210 may include depositing a reflective film on the base substrate 10 formed with the aforementioned pattern, and patterning the reflective film by a patterning process to form a reflective layer pattern. The reflective layer pattern includes at least a reflective layer 40 arranged in the packaging structure layer and a light-transmitting hole 401 arranged in each sub-pixel. A position of the light-transmitting hole 401 corresponds to that of the pixel opening of the light-emitting structure layer 210. Orthographic projections of the light-transmitting holes on the base substrate 10 respectively overlap orthographic projections of the plurality of light-emitting units on the base substrate 10. The reflective layer 40 is used to reflect most of the light incident on the reflective layer 40. In the exemplary embodiment, this patterning process is referred to as a tenth patterning process.

In the exemplary embodiments, an area of the light-transmitting holes 401 on the reflective layer 40 may be about 10% to 40% of a sub-pixel area, that is, on a plane parallel to the display substrate, an area of an orthographic projection of the reflective layer 40 on the base substrate 10 is about 60% to 90% of the sub-pixel area. In the exemplary embodiments, the orthographic projection of the light-transmitting hole 401 on the base substrate 10 may be larger than, equal to or smaller than the orthographic projection of the pixel opening on the base substrate 10. When the orthographic projection of the light-transmitting hole 401 on the base substrate is larger than the orthographic projection of the pixel opening on the base substrate, the area of the light-transmitting holes 401 is greater than that of the light-emitting region, then a display luminance may be improved, but a mirror effect may be weakened. When the orthographic projection of the light-transmitting hole 401 on the base substrate is smaller than the orthographic projection of the pixel opening on the base substrate, the area of the light-transmitting holes 401 is less than that of the light-emitting region, then the mirror effect may be enhanced, but the display luminance may be weakened. In the exemplary embodiments, the area of the light-emitting region is the area of the pixel openings.

In the exemplary embodiments, on a plane parallel to the base substrate, a shape of the light-transmitting hole 401 may be a square, a rectangle, a circle, an ellipse, or a hexagon, etc., and may be set according to actual needs, which is not limited here in the present disclosure.

In the exemplary embodiments, by setting the material of the reflective layer 40, a white mirror effect may be formed, or a colored mirror effect may be formed.

In the exemplary embodiments, the material of the reflective layer 40 for forming the white mirror effect may include a metal material including any one or more of molybdenum (MO), aluminum (Al), titanium (Ti), Ti/Al/Ti, and ITO/Ag/ITO.

In the exemplary embodiments, the material of the reflective layer 40 for forming the colored mirror effect may include a composite structure of a metal and an oxide, or a composite structure of a metal and a compound.

In the exemplary embodiments, the metal in the composite structure may include any one or more of molybdenum (MO), aluminum (Al) and titanium (Ti), and the oxide in the composite structure may include any one or more of Mo oxide, copper (Cu) oxide and niobium (Nb) oxide, or a mixed oxide in which iron oxide and indium oxide are added to $MoO_2$, or a mixed oxide in which ZnO is added to Nb oxide. The compound in the composite structure may include Metal Matrix Composites (MMC).

In the exemplary embodiments, the composite structure includes a stack structure, which may include two or more layers, e.g., Al/MMC, AL/ITO/MMC, AL/SiNx/MMC, etc.

In the exemplary embodiments, the stack structure of metal and oxide or the stack structure of metal and compound may be prepared by a process such as low temperature sputtering or low temperature magnetron sputtering, etc. The prepared stack structure of metal and oxide or stack structure of metal and compound is a dark film with a reflectivity close to that of a circular polarizer, which has the characteristics of low reflectivity.

In the exemplary embodiments, the thickness of the reflective layer 40 may be about 0.10 μm to 0.70 μm. In some possible implementations, the thickness of the reflective layer may be about 0.30 μm to 0.40 μm.

In the exemplary embodiments, the orthographic projection of the reflective layer 40 on the base substrate 10 includes an orthographic projection of the packaging structure layer on the base substrate, so that the packaging structure layer is covered by the reflective layer 40 to improve the mirror effect.

In step S05, a light modulation layer is formed. When manufacturing a display substrate without a reflective layer, the light modulation layer is formed on the light-emitting structure, and when manufacturing a display substrate with a reflective layer, the light modulation layer is formed on the reflective layer. The light modulation layer is used to transmit a part of the light emitted from the plurality of light-emitting units and reflect the other part of the light emitted from the plurality of light-emitting units, and the light modulation layer is configured such that the reflectivity of the light modulation layer to the light in the first wavelength range is greater than that of the light modulation layer to the light outside the first wavelength range. The first wavelength range is within the wavelength range of visible light and is 500 nm or more.

In the exemplary embodiments, forming the light modulation layer on the reflective layer may include: forming an odd number of sub-layers stacked on the base substrate formed with the aforementioned pattern, where the odd number is 3 or more. The odd number of sub-layers include a first sub-layer having a first refractive index and a second sub-layer having a second refractive index, the first sub-layer and the second sub-layer are alternately arranged when formed, as shown in FIG. 4 and FIG. 6. The first refractive index is greater than the second refractive index.

In the exemplary embodiments, the first one and the last one of the plurality of sub-layers are both first sub-layers having the first refractive index.

In the exemplary embodiments, the light modulation layer 30 may include three sub-layers, five sub-layers, seven sub-layers, nine sub-layers, eleven sub-layers, etc., and the number of sub-layers is an odd number.

In the exemplary embodiments, the plurality of sub-layers in the light modulation layer 30 may be sequentially deposited by means of plasma-enhanced chemical vapor deposition (PECVD), and the sequential deposition using the same deposition method may simplify the process because a continuous conversion of devices that may cause a complicated process is not required during the deposition process. In some possible implementations, the plurality of sub-layers in the light modulation layer 30 may be sequentially evaporated by means of evaporation, or may be sequentially deposited by chemical vapor deposition (CVD).

In step S06, a cover layer 60 is formed on the light modulation layer 30. In the exemplary embodiments, forming the cover layer 60 on the light modulation layer 30 may include: bonding the cover layer 60 on the light modulation layer 30 by using an optical adhesive layer 50, as shown in FIG. 3. In the exemplary embodiments, the cover layer 60 may be a glass cover, or a film cover, which may be bonded by a bonding process. For example, an optical adhesive layer 50 is first applied on the light modulation layer 30, and then a glass cover or a film cover is bonded to the optical adhesive layer 50 by a bonding process. In the exemplary embodiments, a thickness of the optical adhesive layer 50 may be about 40 μm to 60 μm, and a thickness of the cover layer 60 may be about 100 μm to 700 μm. In some possible implementations, the thickness of the optical adhesive layer 50 may be about 50 μm, and the thickness of the cover layer 60 may be about 500 μm.

In the exemplary embodiments, a protective layer may be formed on the reflective layer 40 first, and then the light modulation layer 30 is formed on the protective layer. In the exemplary embodiments, the protective layer may be a single-layer structure, and a material of the protective layer may be an optically clear adhesive (OCA), which has high cleanliness, high light transmittance, low haze, high adhesion, no crystal point, no bubble, water resistance, high temperature resistance, UV resistance, etc., and which has uniform thickness and high flatness.

In the exemplary embodiments, a touch functional layer may be formed on the reflective layer first, and then the light modulation layer may be formed on the touch functional layer. In the exemplary embodiments, the touch functional layer may be a multi-layer composite structure that may include a first protective layer, a touch structure layer (TSP) and a second protective layer. The touch structure layer may include a touch electrode layer, or include a touch electrode layer and a touch insulating layer. A material of the first protective layer and the second protective layer may be an optically clear adhesive OCA.

In the exemplary embodiments, the first sub-layer is formed of a silicon nitride material, while the second sub-layer is formed of a silicon oxide material. The first sub-layer is formed with a thickness in a range of 210 nm to 230 nm, and the second sub-layer is formed with a thickness in a range of 70 nm to 90 nm. Alternatively, the first sub-layer is formed with a thickness in a range of 230 nm to 250 nm, and the second sub-layer is formed with a thickness in a range of 110 nm to 130 nm. Alternatively, the first sub-layer is formed with a thickness in a range of 90 nm to 110 nm, and the second sub-layer is formed with a thickness in a range of 65 nm to 85 nm. Alternatively, the first sub-layer is formed with a thickness in a range of 130 nm to 150 nm, and the second sub-layer is formed with a thickness in a range of 240 nm to 260 nm.

In the exemplary embodiments, the first sub-layer is formed of a titanium oxide material, while the second sub-layer is formed of a silicon oxide material. The first sub-layer is formed with a thickness in a range of 80 nm to 100 nm, and the second sub-layer is formed with a thickness in a range of 85 nm to 105 nm. Alternatively, the first sub-layer is formed with a thickness in a range of 110 nm to 130 nm, and the second sub-layer is formed with a thickness in a range of 85 nm to 105 nm.

Another aspect of the present disclosure provides a display device including the display substrate described above. The display device may include any device or product having a display function. For example, the display device may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as head-mounted device, electronic clothing, electronic wristband, electronic necklace, electronic accessory, electronic tattoo, or smart watch), a television, etc.

Another aspect of the present disclosure provides a wearable device including the display substrate described above. The wearable device may be, for example, watch, glasses, clothes, helmet and other devices with a display device.

Another aspect of the present disclosure provides a method of displaying by the display device described above, specifically including: emitting, by a light-emitting unit of a light-emitting unit layer, light in a second wavelength range for display; transmitting most of the light in the second wavelength range through a light modulation layer; and reflecting, by the light modulation layer, most of light in a first wavelength range complementary to the light in the second wavelength range, where the light modulation layer exhibits a color corresponding to the light in the first wavelength range, so that a color of the light in the second wavelength range emitted by the light-emitting unit layer and the color exhibited by the light modulation layer have a larger color gamut range.

According to the embodiments of the present disclosure, the light modulation layer reflects the light in the first wavelength range and exhibits a color corresponding to the light in the first wavelength range, while the light-emitting unit layer emits the light in the second wavelength range complementary to the light in the first wavelength range. The light modulation layer has a high transmittance and a low reflectivity to the light in the second wavelength range. Therefore, the color of the light in the second wavelength light emitted by the light-emitting unit and the color of the light in the first wavelength range reflected by the light modulation layer have a larger color gamut. In this case, a display information of the light-emitting unit is more obvious under the color exhibited by the light modulation layer, which may make up for the disadvantage of color deviation.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:
a base substrate;
a light-emitting unit layer arranged on the base substrate, wherein the light-emitting unit layer comprises a plurality of light-emitting units respectively emitting light of a plurality of colors; and
a light modulation layer located on a side of the light-emitting unit layer away from the base substrate, and configured to transmit a part of the light emitted from the plurality of light-emitting units and reflect the other part of the light emitted from the plurality of light-emitting units, the light modulation layer is a continuous integral layer, and orthographic projections of the plurality of light-emitting units on the base substrate fall within an orthographic projection of the light modulation layer on the base substrate;
wherein the light modulation layer is configured such that a reflectivity of the light modulation layer to light in a first wavelength range is greater than that of the light modulation layer to light outside the first wavelength range, and the first wavelength range is within a wavelength range of visible light and is 500 nm or more;
wherein the light modulation layer is further configured to reflect light in the first wavelength range in environment; and
wherein the light-emitting unit of the light-emitting unit layer is configured to emit light in a second wavelength range complementary to the light in the first wavelength range.

2. The display substrate of claim 1, wherein the light modulation layer comprises an odd number of sub-layers arranged in stack, and the odd number is 3 or more; and
wherein the odd number of sub-layers comprise a first sub-layer having a first refractive index and a second sub-layer having a second refractive index, the first sub-layer and the second sub-layer are alternately arranged, and the first refractive index is greater than the second refractive index.

3. The display substrate of claim 2, wherein the first refractive index is in a range of 1.6 to 2.5, and the second refractive index is in a range of 1.3 to 1.5.

4. The display substrate of claim 2, wherein the first sub-layer contains silicon nitride, and the second sub-layer contains silicon oxide.

5. The display substrate of claim 4, wherein,
a thickness of the first sub-layer is in a range of 210 nm to 230 nm, a thickness of the second sub-layer is in a range of 70 nm to 90 nm, and the first wavelength range is 500 nm to 600 nm; or
the thickness of the first sub-layer is in a range of 230 nm to 250 nm, the thickness of the second sub-layer is in a range of 110 nm to 130 nm, and the first wavelength range is 600 nm to 760 nm; or
the thickness of the first sub-layer is in a range of 90 nm to 110 nm, the thickness of the second sub-layer is in a range of 65 nm to 85 nm, and the first wavelength range is 580 nm to 630 nm; or
the thickness of the first sub-layer is in a range of 130 nm to 150 nm, the thickness of the second sub-layer is in a range of 240 nm to 260 nm, and the first wavelength range is 630 nm to 670 nm.

6. The display substrate of claim 2, wherein the first sub-layer contains titanium oxide, and the second sub-layer contains silicon oxide.

7. The display substrate of claim 6, wherein, the thickness of the first sub-layer is in a range of 80 nm
to 100 nm, the thickness of the second sub-layer is in
a range of 85 nm to 105 nm, and the first wavelength
range is 500 nm to 600 nm; or the thickness of the first sub-layer is in a range of 110 nm
to 130 nm, the thickness of the second sub-layer is in
a range of 85 nm to 105 nm, and the first wavelength
range is 600 nm to 760 nm.

8. The display substrate of claim 2, wherein the light
modulation layer comprises five sub-layers, and the five
sub-layers comprise three first sub-layers and two second
sub-layers.

9. The display substrate of claim 1, further comprising a
reflective layer located between the light-emitting unit layer
and the light modulation layer, wherein the reflective layer
is provided with a plurality of light-transmitting holes,
orthographic projections of the plurality of light-transmit-
ting holes on the base substrate respectively overlap ortho-
graphic projections of the plurality of light-emitting units on
the base substrate, and the reflective layer is configured to
reflect most of light incident on the reflective layer.

10. A display device comprising the display substrate of
claim 1.

11. A wearable device comprising the display substrate of
claim 1.

* * * * *